United States Patent [19]

Dwyer

[11] Patent Number: 5,970,400
[45] Date of Patent: *Oct. 19, 1999

[54] ADJUSTING THE TIMING AND SYNCHRONIZATION OF A RADIO'S OSCILLATOR WITH A SIGNAL FROM AN SATPS SATELLITE

[75] Inventor: Rex Dwyer, Palo Alto, Calif.

[73] Assignee: Magellan Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/644,639

[22] Filed: Apr. 30, 1996

[51] Int. Cl.$^6$ .................................................. H04B 1/40
[52] U.S. Cl. .................... 455/254; 455/258; 455/266; 455/295; 455/265
[58] Field of Search ......................... 364/449.7; 342/357; 375/362, 200; 455/254, 255, 257, 258, 259, 266, 339, 295, 310, 307, 119, 63, 265, 13.2; 368/47; 968/922

[56] References Cited

U.S. PATENT DOCUMENTS

| | | | |
|---|---|---|---|
| 3,763,492 | 10/1973 | Easton | 455/265 |
| 4,270,193 | 5/1981 | Ichikawa . | |
| 4,301,537 | 11/1981 | Roos . | |
| 4,582,434 | 4/1986 | Plangger et al. | 368/47 |
| 4,760,586 | 7/1988 | Takeda . | |
| 4,941,150 | 7/1990 | Iwasaki | 375/200 |
| 5,056,108 | 10/1991 | Lund . | |
| 5,220,687 | 6/1993 | Ichikawa et al. | 455/254 |
| 5,222,075 | 6/1993 | Richley . | |
| 5,241,562 | 8/1993 | Partyka et al. . | |
| 5,365,550 | 11/1994 | Roberson . | |
| 5,386,435 | 1/1995 | Cooper et al. . | |
| 5,408,506 | 4/1995 | Mincher et al. . | |
| 5,440,313 | 8/1995 | Osterdock et al. | 375/362 |
| 5,481,258 | 1/1996 | Fawcett et al. . | |
| 5,629,649 | 5/1997 | Ujiie | 455/13.2 |
| 5,717,403 | 2/1998 | Nelson et al. | 375/200 |

FOREIGN PATENT DOCUMENTS

| | | |
|---|---|---|
| 0283106 | 1/1988 | European Pat. Off. . |
| 0551126A1 | of 1993 | European Pat. Off. . |
| WO9407314 | of 1994 | WIPO . |
| WO9504311 | 2/1995 | WIPO . |

OTHER PUBLICATIONS

FCC Regulation 47 CFR 15.247, Oct. 1994.

*Primary Examiner*—Nguyen Vo
*Assistant Examiner*—Lester G. Kincaid
*Attorney, Agent, or Firm*—Majestic, Parsons, Siebert & Hsue

[57] ABSTRACT

A communication system is provided for increasing communication range between at least two radio communication devices without increasing the output power of transmitted radio signals from the devices, and without increasing the antenna gain of the received signals. Each radio device includes an oscillator for generating a carrier reference signal, and an SATPS receiver which receives at least one standard timing reference signal from at least one SATPS satellite. The received standard timing reference signal is used to continuously adjust the timing and synchronization of the oscillator to improve the accuracy of the carrier frequency signal. The improved accuracy in the carrier frequency signal may then be used to reduce the bandwidth of the modulated carrier frequency signals generated by the radio device to thereby increase the effective communication range and sensitivity of the device.

24 Claims, 7 Drawing Sheets

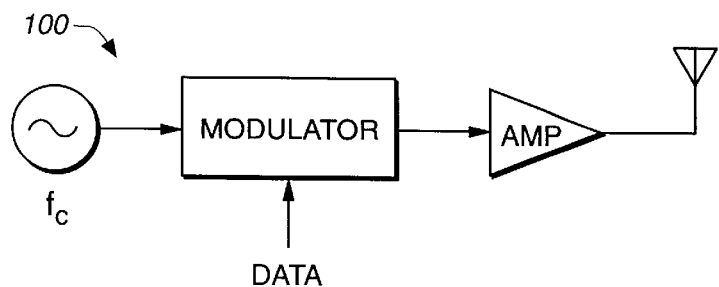
FIG._1A
*(PRIOR ART)*
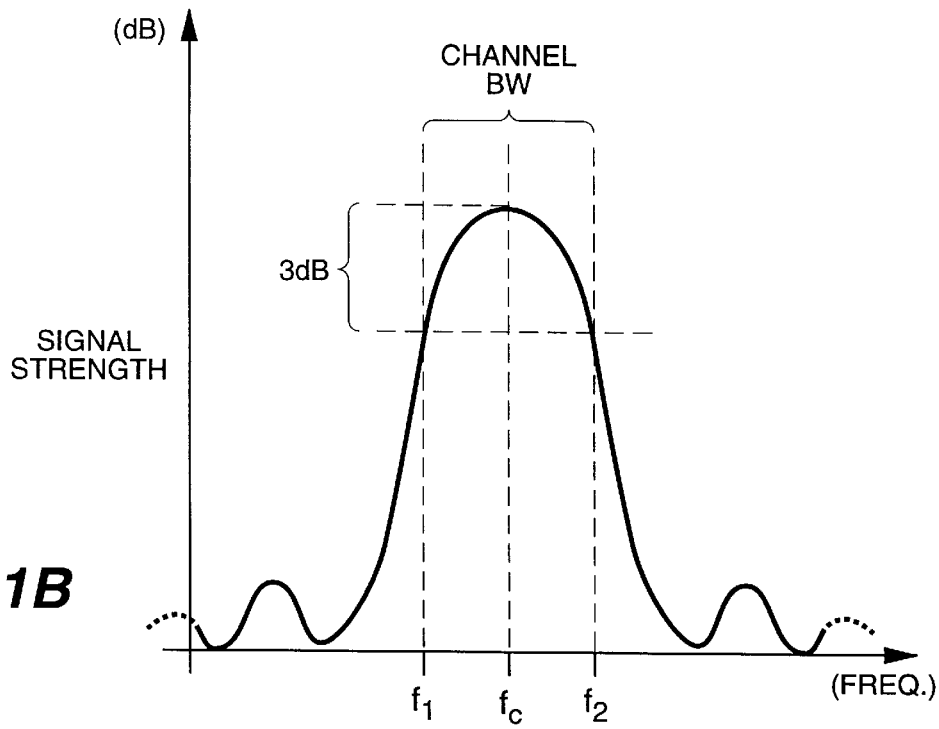
FIG._1B
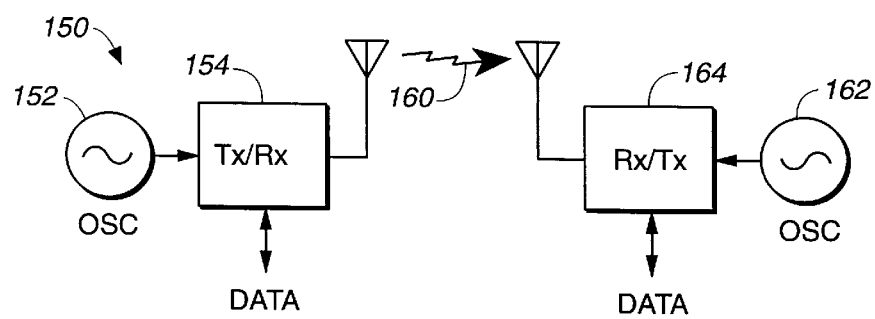
FIG._1C
*(PRIOR ART)*

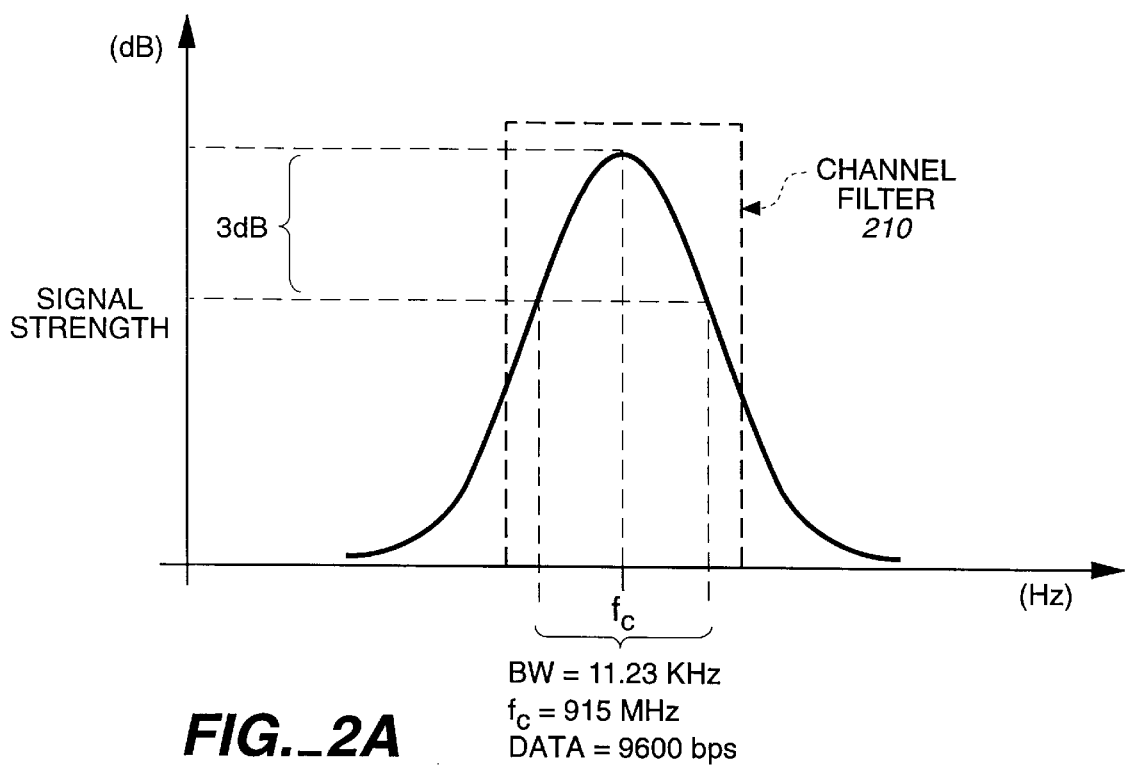
FIG._2A
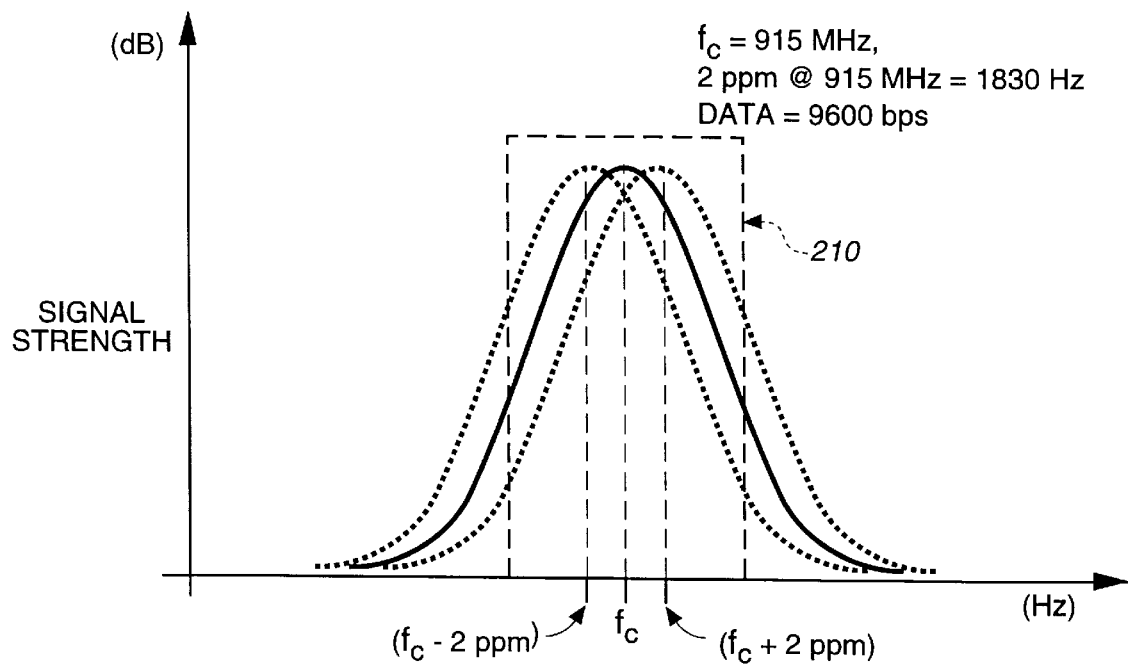
FIG._2B

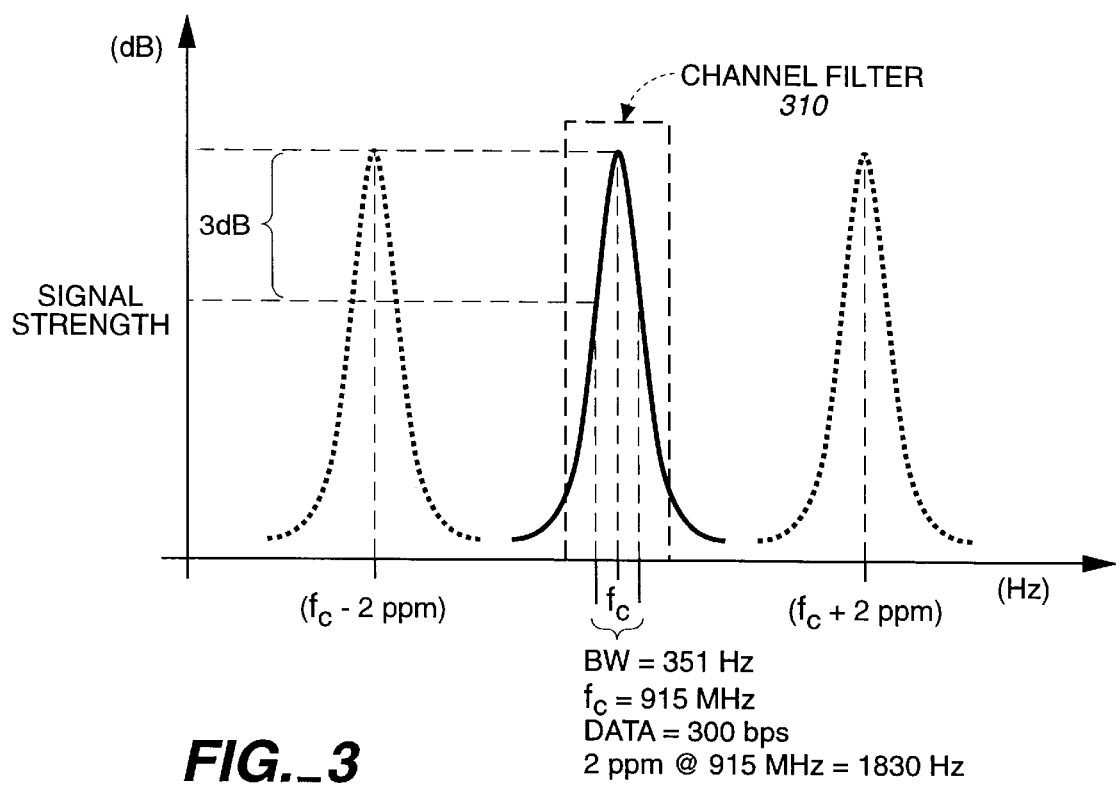
FIG._3
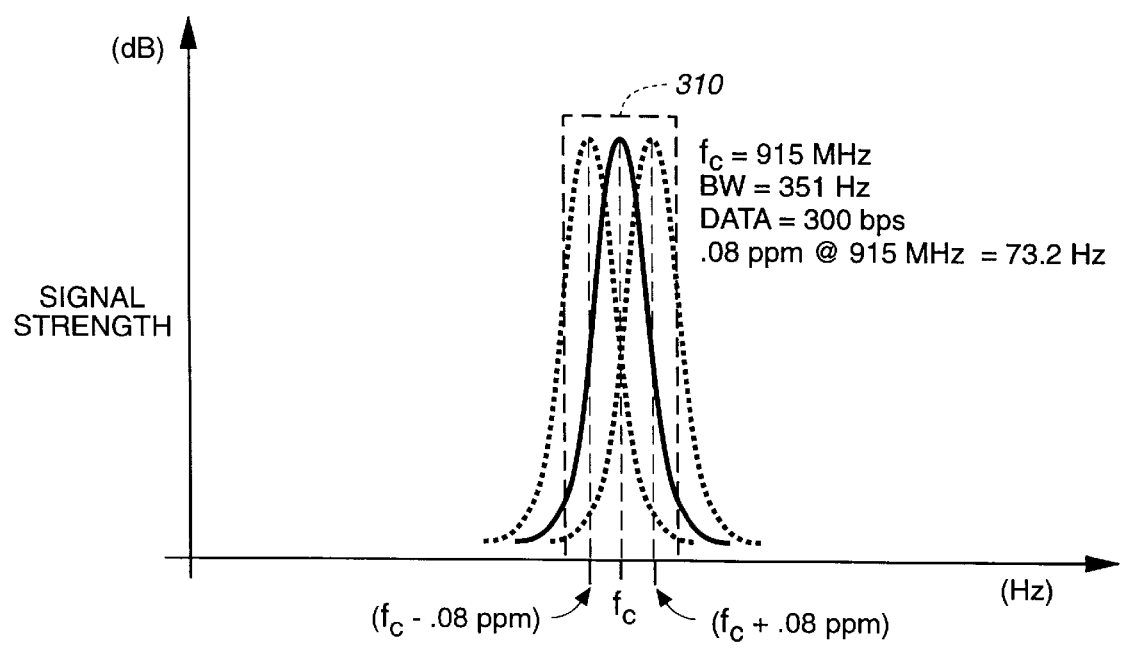
FIG._5

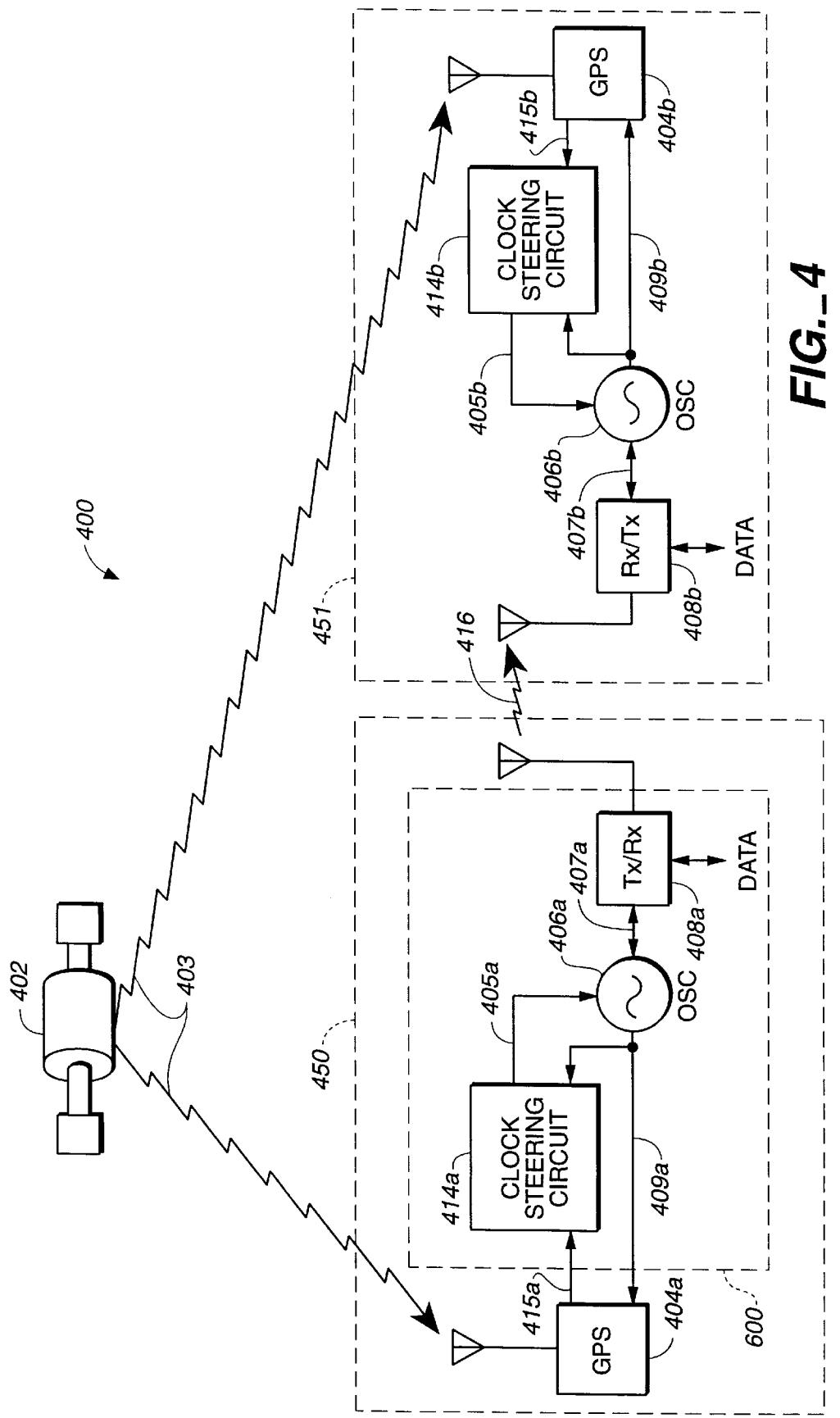
FIG._4

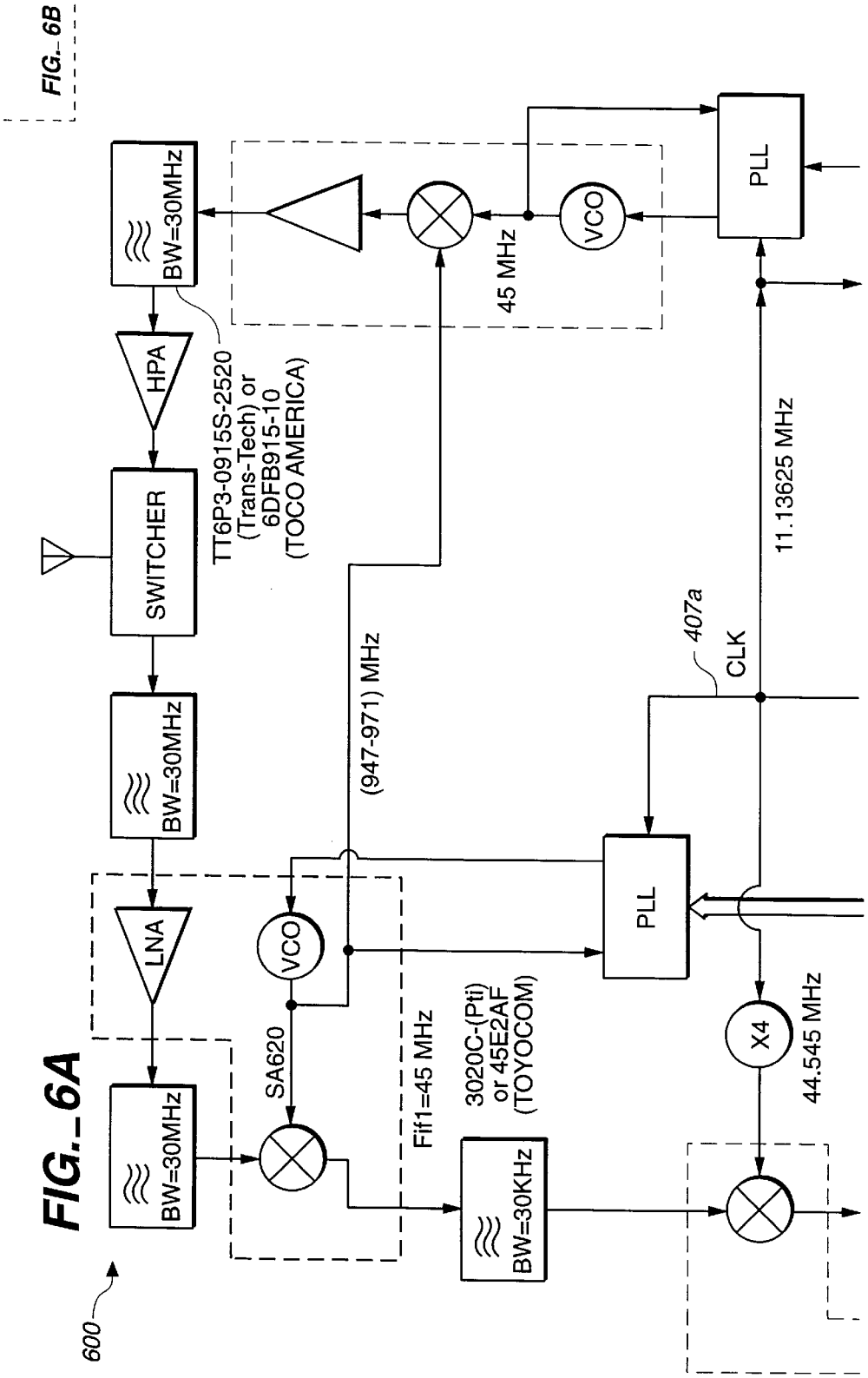

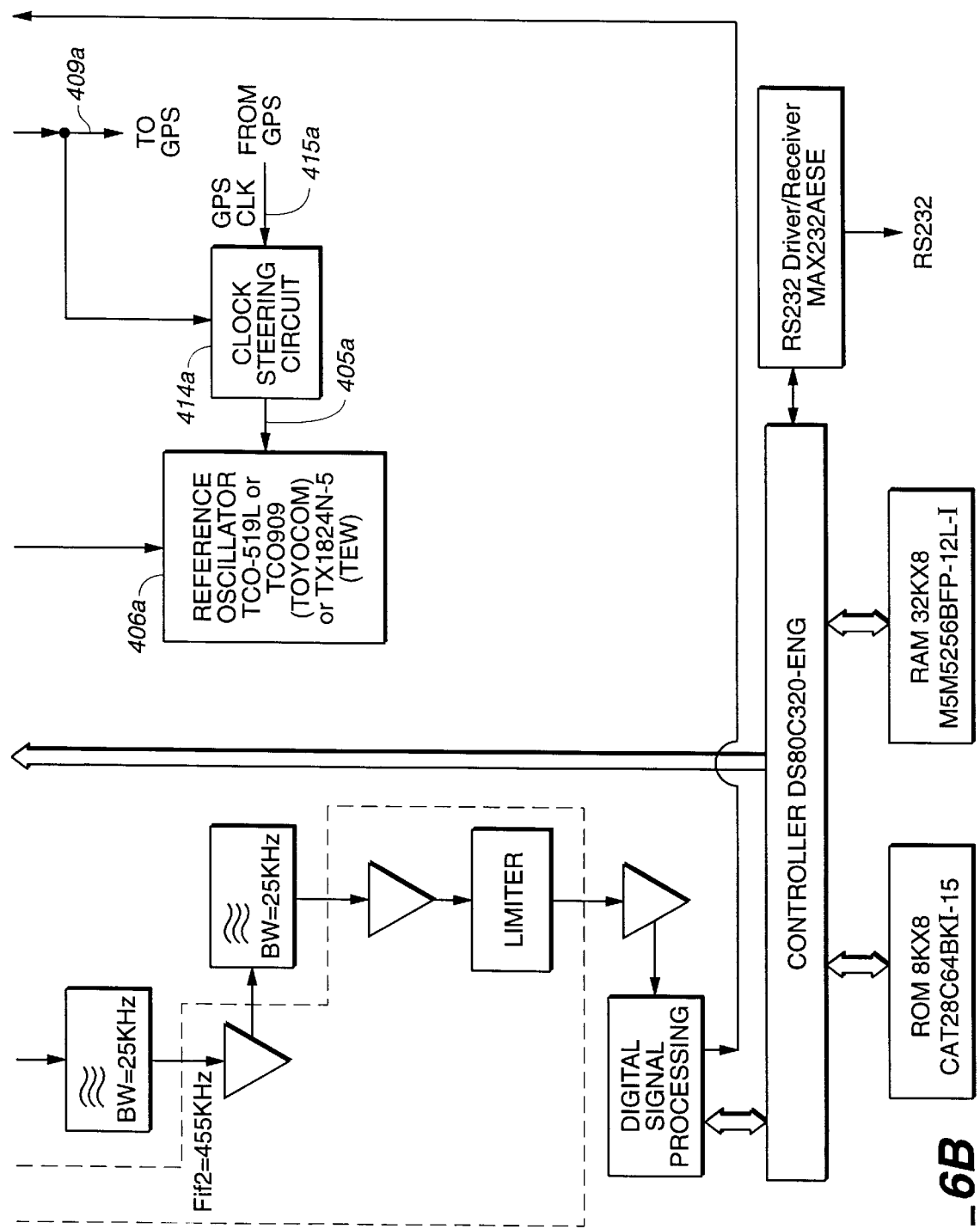
FIG._6B

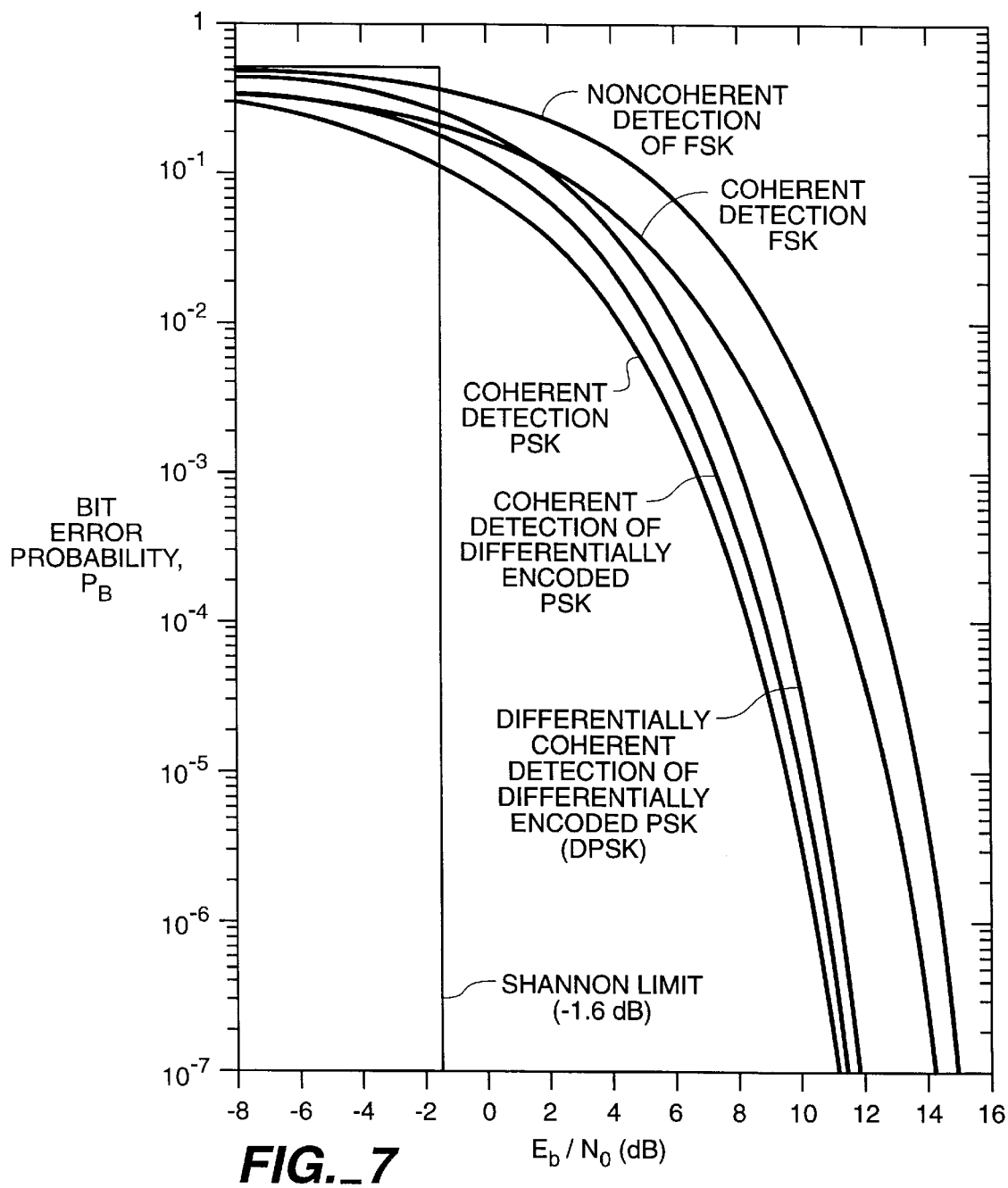
FIG._7

ADJUSTING THE TIMING AND SYNCHRONIZATION OF A RADIO'S OSCILLATOR WITH A SIGNAL FROM AN SATPS SATELLITE

BACKGROUND OF THE INVENTION

The present invention relates generally to the field of wireless data communication networks and, in particular, to an improved, low power wireless radio system linked to a GPS receiver for increasing effective communication range without increasing output power of the transmitted signals.

Low power wireless data communications networks are used in a number of environments in which it is either impractical to run cabling for the local area network to fixed terminal sites, or where there is a need for mobile terminals that are in communication with the network. Examples of the former include rail yards, and other operations spread over a large area. In the latter category falls a common use of such systems, normally warehouses for stocking goods for shipment or accepting parts to be used in a manufacturing process. A typical system includes multiple base stations inter-connected by cabling to a network controller that processes the data received over the network and controls the transmission of data back to remote terminals through the base stations. A typical arrangement is one in which the network controller communicates with the host via serial data links employing twisted pair cabling.

The base stations communicate via wireless radio frequency link with a plurality of remote terminals that are typically either hand held or mounted on a vehicle such as a fork lift, cart or truck. Typical terminals include keyboards and displays and some are equipped with scanning bar code readers. The networks may be used as part of any underlying system for operation of the facility in which they are used, such as assistance in taking inventory, filling orders, directing employees as to the placement of inbound products in the warehouse space and the like. Information from the remote terminals is normally entered via key pad or bar code reader. It may indicate that an assigned task has been completed, that problems have been encountered such as the absence of sufficient goods of a particular type to fill a particular order, and so forth.

Any application that the user wishes to implement, that can be handled by the host computer, can be implemented by using the wireless data communications network. For example, the host computer can determine minimum length paths for filling particular orders and transmit to a remote terminal located on a transportation device in a warehouse the sequence in which items should be selected for filling a particular order. The systems are also very useful in environments in which just in time parts inventory systems are implemented for prioritizing movement of materials from a receiving dock to locations in a warehouse or manufacturing facility at which they are needed.

Another application where it is desirable to use mobile terminals that are in communication with a centralized computer network is in the area of geodetic surveying. Modern techniques for performing geodetic surveying typically include mobile geodetic survey stations which utilize GPS or other satellite positioning signals (SATPS) for determining precise coordinates of ground locations on the earth's surface. However, in many instances, the GPS receivers utilized by the geodetic survey stations are not able to provide precise coordinate positions of sufficient accuracy.

For this reason, in order to improve the measurable accuracy of the GPS coordinates at a particular ground location, the geodetic survey station at the ground location communicates by wireless radio transmission with a base reference station having precisely known coordinates. The information transmitted by the base station is used by the remote survey station to correct for coordinate measurement error inherent in the mobile GPS receiver. In this way, by combining the GPS positional information from the GPS receiver with the correctional information transmitted by the base reference station, precise coordinates of the ground location at the mobile survey station may be quickly and accurately determined. Additionally, if desirable, the base reference station may upload information transmitted from the mobile station for use in developing a resource or GIS map of the surveyed area.

Largely by regulatory constraint in the United States of America, wireless, mobile communication systems are typically operated at a low power level since the authorized radio transmissions for such applications are in shared portions of the electromagnetic spectrum under the regulatory scheme implemented by the United States Federal Communications Commission (FCC). Since 1985, the FCC has approved the use of low power non-license Business Radio Systems regulated under Sub-part D of Part 15 of Title 47 of the Code of Federal Regulations (CFR). Three bands are authorized for such use: 902 through 928 MHz, 2400 through 2483.5 MHz, and 5725 through 5850 MHz. According to 47 CFR Section 15.247, for example, there are a number of constraints on the operations of such systems including a maximum radiated power of 1 watt, and a limitation on spectrum spreading techniques to direct sequencing and frequency hopping. A copy of 47 CFR Section 15.247 is provided as Appendix A of this application.

In view of the above cited regulatory constraints and common sense, it is desirable for the radio frequency networks described above to utilize low radiated power. Warehouse facilities are often concentrated in the same geographic area and a high level of radiated power increases the probability of intersystem interference. For the devices that operate in the shared portions of the electromagnetic spectrum, there is also a need to minimize the radiated power to avoid interference with other devices operating on the same frequencies. Additionally, a system that is designed for relatively high power output would require high radiated power from its roaming terminals, which are typically battery operated. This situation would lead to requirements for larger, heavier batteries or shorter battery life.

One advantage of operating a radio device in compliance with the FCC regulations is that the user is not required to obtain an FCC license in order to operate such radio devices. For example, radio devices operating at 902 MHz and broadcasting at a maximum radiated power of 1 watt do not require an FCC licensed user for operation. However, the same radio device operating at a radiated power of over 1 watt requires a FCC licensed user to operate the radio. Thus, radio devices using a maximum radiated power of 1 watt are made accessible to virtually an unlimited number of users. Unfortunately, by limiting the maximum radiated power of the radio device to 1 watt, the effective communication range of that radio device is also limited since the power of the output signal is directly proportional to the communication range of the radio device.

In applications such as geodetic surveying, however, large areas of land are typically required to be surveyed, encompassing tens or even hundreds of square miles. It is therefore desirable for each of the radio devices at each of the respective remote survey stations to be able to extend its effective communicating range within the wireless network as far as possible while simultaneously complying with FCC regulations such as those described above.

It is therefore an object of the present invention to provide a wireless radio communication network including at least one radio device which can be operated by any user (without requiring an FCC license), and which provides for an extended range of communication over that of similar-type conventional radio devices. A further object of the present invention is to provide the wireless radio communication device having improved sensitivity and accuracy for facilitating transmission and/or reception of modulated carrier frequency signals.

SUMMARY OF THE INVENTION

These and additional objects are accomplished by the various aspects of the present invention wherein, briefly, according to a principal aspect, a communication system is described which provides for increased communication range between at least two radio communication devices without increasing the output power of transmitted radio signals from the devices, and without increasing the antenna gain of the received signals. Each radio device includes an oscillator for generating a carrier reference signal, and an SATPS receiver which receives at least one standard timing reference signal from at least one SATPS satellite. Means are provided within the radio device for utilizing the standard timing reference signal to continuously adjust the timing and synchronization of the oscillator to improve the accuracy of the carrier frequency signal. The improved accuracy in the carrier frequency signal results in improved wireless communication between the two radio devices.

Additionally, by synchronizing or phase locking each of the oscillators in the system to the independent, SATPS timing reference signal, each of the oscillators in the system will also be synchronized to each other. This eliminates the need to carry out synchronization procedures which are typically encoded into a portion of the communication signal transmitted between the two radio devices.

Furthermore, means may also be included in the system for using the improved accuracy of the carrier frequency signal to reduce the bandwidth of the modulated carrier frequency signals generated by the radio device to thereby increase the effective communication range and sensitivity of the device.

A second aspect of the present invention is directed to a wireless radio communication system comprising at least one wireless radio device including an oscillator for generating a carrier frequency signal, and including an SATPS receiver for receiving at least one standard SATPS timing reference signal. The system also includes range improving means in communication with the SATPS receiver and the radio device for improving the effective communication range of the radio device by using the SATPS timing reference signal to improve the accuracy of the carrier frequency signal and simultaneously decreasing the bandwidth of data communication of the radio device. Additionally, the increased range of the radio system of the present invention is accomplished without increasing the output power of the radio communication signals or the antennae gain of the receiver.

A third aspect of the present invention is directed to a method of improving the communication range of a radio communication system which includes a SATPS receiver and an oscillator for generating a carrier frequency signal. The method includes the steps of receiving at least one standard timing reference signal from at least one SATPS satellite; using the received timing reference signal to continually correct and maintain precise timing and synchronization of the oscillator to thereby provide improved accuracy of the carrier frequency signal; and utilizing the improved accuracy of the carrier frequency signal to increase the effective communication range of the radio device by reducing the bandwidth of data communication signals generated by the radio device.

By applying the technique of the present invention to conventional radio communication systems (such as those, for example, which do not require a licensed FCC user for operation), an improvement in the sensitivity of the radio device may be achieved. More specifically, a gain in the signal-to-noise ratio by at least 15 dB may be achieved without increasing the output power of the transmitted signal, without increasing the antennae gain of the received signal, and without relying upon conventional oscillator synchronization techniques which embed oscillator synchronization information into a portion of the radio signal. This increase in the signal-to-noise ratio of the radio communication technique of the present invention, in turn, results in a relative increase in the effective communication range of the radio device by about a factor of five times its conventional range.

Additional objects, features, and advantages of the various aspects of the present invention will become apparent from the following description of the preferred embodiment, which description should be taken in conjunction with the accompanying drawings.

BRIEF DESCRIPTION OF THE DRAWINGS

FIG. 1A illustrates a conventional modulated carrier frequency radio communication device.

FIG. 1B illustrates a standard modulated carrier frequency signal, showing the channel bandwidth of the signal.

FIG. 1C illustrates a conventional radio communication system including two wireless radio communication devices.

FIG. 2A illustrates a portion of a conventional modulated carrier frequency signal 160 of FIG 1C.

FIG. 2B illustrates the expected distribution of the modulated carrier frequency signal 160 of FIG. 1C, centered around a carrier frequency of $f_c$ ±2 ppm, with a modulated data rate of 9600 bps.

FIG. 3 illustrates the expected distribution of the modulated carrier frequency signal of FIG. 1C centered around a carrier frequency signal of $f_c$+2 ppm, with a modulated data rate of 300 bps.

FIG. 4 shows a block diagram of the radio communication system of the present invention, illustrating how it works in conjunction with SATPS signals generated from at least one SATPS satellite.

FIG. 5 illustrates the expected distribution of the modulated carrier frequency signal 416 of FIG. 4, centered around a carrier frequency of $f_c$+0.08 ppm, with a modulated data rate of 300 bps.

FIG. 6 illustrates a schematic diagram of the radio communication device 600 of FIG. 4.

FIG. 7 shows a graph of bit error probablilties for several types of binary communication systems.

DETAILED DESCRIPTION OF THE PREFERRED EMBODIMENT

Review of Spread Spectrum Technology

Spread spectrum technology has been known for a number of years. Generally speaking, a spread spectrum radio signal is one for which the information signal is dynamically spread over a relatively wide bandwidth as opposed to systems that communicate using conventional narrow band techniques with fixed carrier frequencies. Early development of spread spectrum techniques was principally in the field of military communications because of the opportunities that a spread spectrum system gives the designer to make it resistant to attempts to jam a transmission and its resistance to interception. With respect to the latter characteristic, typically military spread spectrum systems minimize the transmission of information that is needed and useable for synchronizing the receiver to the particular spectrum spreading technique employed at the transmitter. The receiver must have knowledge of the spectrum spreading technique employed by the transmitter in order to perform a complementary operation at the receiving end so that the information can be retrieved from the received signal.

In non-military commercial applications, such as networks of the type that may embody the present invention, the resistance to interception is normally not a concern. However, the resistance to jamming manifests itself as a resistance to destructive interference from other users of the spectrum including adjacent radio frequency networks. One fundamental advantage of spread spectrum systems is that multiple systems operating in the same bandwidth look like noise sources to their neighbors.

When the use of spread spectrum for such applications was first allowed by the United States Federal Communications Commission, several manufacturers entered the field with direct sequence spread spectrum systems. A direct sequence system is relatively straight forward to implement. In a direct sequence system the transmitted data stream is multiplied (for example, via an EXCLUSIVE OR function) with a pseudo random sequence, normally referred to as a chip code. The bit rate of the pseudo random sequence exceeds the bit rate of the data signal. The output from the EXCLUSIVE OR operation is provided to a phase shift keyed modulator and modulates a fixed frequency carrier. Since the pseudo random bit sequence has statistics that approximate noise, this has the effect of transmitting a signal which looks like broad band noise with only a relatively nominal power peak centered about the carrier frequency.

At the receiving end a correlator, which must be synchronized to the pseudo random bit sequence used at the transmitter, is used to reverse the process and reassemble the original data stream.

Part of what made direct sequence spread spectrum systems attractive is the relatively low cost and the ability to retrofit to certain aspects of existing designs. In particular, since such systems transmit on a fixed frequency carrier, only the front end processing of the digital data stream, i.e., multiplying by the chip code, need be changed. In other words prior art designs fixed carrier frequency transmitters can continue to be used. The conventional wisdom among designers of radio frequency data transmission networks has been that the use of a frequency hopping technique for spreading the transmission spectrum would cause the systems to be complex and expensive. Furthermore, it was believed that it would be difficult to design battery operated terminals that were competitive with other conventional fixed carrier systems or direct sequence spread spectrum systems with respect to battery size/weight and battery life considerations.

While a direct sequence spread spectrum system gives some advantages as compared to narrow band FM systems, there are a number of inherent characteristics of direct sequence systems that offset the advantages gained from the spreading of the spectrum. In particular, typical applications for low power radio frequency data communications network are in relatively large facilities. Thus they typically employ multiple base stations that define different coverage cells. Since the coverage area for a 1 watt transmitter may typically be on the order of tens of thousands of square feet, many of these systems employ multiple base stations which operate in physically adjacent cells. The multiple base stations are therefore designed so that they do not interfere with each other.

With direct sequence techniques, the only practical approach to the design of multiple base station systems is to channelize the different base stations. Since the direct sequence spread spectrum systems have a constant carrier frequency, the channelization defines a plurality of channels with sufficient inter-channel spectral spacing to avoid adjacent channel interference. There are thus a finite number of channels that are available for use in a given portion of the spectrum in which these devices can operate.

Channelized direct sequence spread spectrum (DSSS) systems are more susceptible to narrow band interference than frequency hopping spread spectrum systems (FHSS). Since, by regulatory constraint, these operate in shared portions of the spectrum (in the U.S.A.), there are a number of sources that can and sometimes do interfere with particular channels of a channelized DSSS system. This is particularly true in the 902 through 928 MHz band.

It should be kept in mind that regulatory constraint requires the low power communication device in a Business Radio System to operate without interfering with other users of this portion of the spectrum, but the converse is not true. Thus it is incumbent upon designers of radio frequency networks of this type to design the systems so that they do not interfere with other users of the spectrum. They also should minimize the susceptibility of their network to interference from existing sources, which are not constrained to pay them the same courtesy. Among the authorized uses of the 902 through 928 MHz spectrum in the United States of America are government radio location services, private operational fixed microwave systems, automatic vehicle monitoring systems, portions of the amateur ratio services (ham radio), and anti-shoplifting devices used in retail establishments. Once a channelized DSSS system is installed, an authorized use of the spectrum that interferes with one or more of the channels of the DSSS system may be subsequently established in a neighboring area. This can lead to a breakdown of the operability of a system and may require the system operator to terminate the use of certain channels that the system was designed to use.

Additionally, in DSSS systems, the coverage area tends to decrease as the data rate increases, and the jamming margin decreases with data rate. As noted above, the resistance to jamming is one of the principle benefits of use of spread spectrum transmission techniques. The jamming margin is a figure of merit that relates to the resistance of the system to interference. The jamming margin is defined as $G_p - [L_{sys} + [S/N]_{out}]$ where $G_p$ is the processing gain of the system, $L_{sys}$ are the system losses, and $[S/N]_{out}$ is the output signal to noise ratio. The process gain is a figure of merit indicative of the information throughput gain by employment of the spread spectrum technique in use. In particular, use of spread spectrum techniques allows a system to be designed with a higher information rate under current regulations. The processing gained in a DSSS system is approximately equal to the ratio of the channel bit rate (i.e., the chip rate) to the information bit rate. Therefore, as the information bit rate rises, the ratio of this rate to the channel bit rate decreases and the jamming margin is lowered. In a frequency hopping spread spectrum system, the processing gain is directly related to the ratio of the total channel bandwidth to the bandwidth occupied during each hop.

Thus, while there are advantages to be gained from DSSS systems, they are more susceptible, as compared to a frequency hopping spread spectrum system, to interference. This is particularly true in the regulatory environment within the United States of America where licensed relatively high powered radiators operate in the same portions of the spectrum.

Also, some of the inherent benefits of the use of existing fixed carrier frequency technology in the design of DSSS radio frequency networks is offset as multiple channel/multiple base station systems are implemented. This is because movable, i.e., roaming, terminals within the system are typically designed to accommodate handing off between channels as they move out of the coverage area of one base station into the coverage area another. Therefore, the benefit of the relative simplicity of the roaming terminal receiver circuitry is offset as the need to accommodate the reception of multiple channels on the same system arises.

A frequency hopping spread spectrum system (FHSS) typically has a lower data rate than a roughly equivalent DSSS. However, both DSSS and FHSS systems have significantly higher data rates than prior art narrow band FM devices. For example, typical narrow band FM products may provide 9600 bit per second (bps) data rates whereas spread spectrum systems may achieve data rates of 64 kilobits per second. As the desirability to transmit wireless data increases, there is a corresponding desire to increase the data rate or bandwidth of transmitted data in order to reduce the amount of time necessary to perform such data transfers.

It has been recognized for some period of time that frequency synthesizer designs needed for a frequency hopping spread spectrum system is more complex and consumes more power than that required in a direct sequence direct spread spectrum system. While roaming terminals are preferably designed to accommodate different channels, they need only be designed so that they can make the transition from cell to cell in an appropriate manner and then remain on the channel for the cell in which they are operating until they move to the next adjacent cell. Typically, a frequency hopping system is constantly and rapidly changing the transmitted and received frequencies and this leads to both a more complex system and a higher power consumption.

Furthermore, in a frequency hopping system, the complex synthesizer design needs to be included in the transmitters and receivers at the base stations, thus increasing complexity and cost. As noted above, prior art spread spectrum radio frequency data communication networks were uniformly direct sequence systems. It is believed that this was in large part due to the belief that the complexity and power consumption that would be required for the roaming terminals would be such that they would have unacceptably short battery lives or would require bulky and heavy batteries that would make users reluctant to use such systems. Indeed, these problems are present, however the technique of the present invention addresses and overcomes many of these problems.

A detailed discussion of spread spectrum technology, along with its commercial applications, is provided in the book *Spread Spectrum Systems with Commercial Applications*, Robert C. Dixon, Wiley-Interscience Publications, New York, 1994 (3rd Ed.), herein incorporated by reference in its entirety. Additionally, a general discussion of digital communications is provided in the book *Digital Communications: Fundamentals and Applications*, by Bernard Sklar, P. T. R. Prentice Hall Publications, New Jersy, 1988, herein incorporated by reference in its entirety.

Inherent Problems of Carrier Frequency Modulation

FIG. 1A illustrates a conventional radio system wherein data is modulated on top of a carrier frequency ($f_c$) and transmitted as an output signal. The resulting signal is illustrated in FIG. 1B. As commonly known to those skilled in the art, the bandwidth of the signal shown in FIG. 1B is equal to the 3-dB bandwidth of the spectrum. That is, the bandwidth is defined as that portion of the spectrum where the signal strength is within 3-dB of its peak strength. In FIG. 1B, the 3-dB points are defined as $f_1$ and $f_2$. The channel bandwidth therefore may be expressed by the equation $BW=f_2-f_1$.

FIG. 1C illustrates a conventional wireless radio system comprising two radio devices 154 and 164. Each radio device includes a respective oscillator 152, 162 for independently generating a respective carrier frequency signal for each respective radio device 154, 164.

FIG. 2A shows an example of a communication signal 160 of FIG. 1C. For illustrative purposes, it is assumed that the signal of FIG. 2A is a carrier frequency modulated signal using a conventional modulation technique known as minimum shift keying (MSK) modulation. Further, assumptions are that the carrier frequency ($f_c$) of the signal is 915 MHz, and the rate of data transmission is 9600 bits per seconds (bps). As commonly known to those skilled in the art, the bandwidth of a carrier frequency modulated signal is directly proportional to the rate of data transmission of the modulated signal. For the MSK modulation scheme, the channel bandwidth is defined as being approximately equal to 1.17 times the data transmission rate. Thus, in the example of FIG. 2A, the channel bandwidth (BW) is equal to 1.17× 9600=11.23 KHz.

It is to be noted that other modulation schemes other than MSK may be used to modulate the carrier signals. Other modulation schemes include, for example, GMSK, FSK, BPSK, PAM, QPSK, OQPSK, and other modulation schemes commonly known to those skilled in the art. Each of these different modulations schemes have associated with it a particular constant multiplier for determining the channel bandwidth of a signal using that particular modulation scheme.

In order to achieve accurate resolution of the transmitted signal and to reduce interference due to multipath fading and noise, for example, conventional RF receivers are equipped with a channel filter or band pass filter which permits only a narrow band of wavelengths to be passed on through to the decoder or demodulator. As shown in FIG. 2A, a channel filter 210 accommodates a bandwidth which is slightly larger than the bandwidth of the transmittal signal. In this way, the channel bandwidth of the modulated signal is passed through, while the remainder of the electromagnetic spectrum is blocked out to minimize obscuring effects of the signals due to interference or noise.

It is to be noted that in the field of digital communications, the filtering effect upon the signal may be achieved by the use of either an analog filter, a digital filter, and/or by software processing the digital information. Thus, for example, a bandpass filter (or other type of filter) may be implemented in digital form or may be implemented via software. Moreover, digital signal processing may be applied to the signal in order to reduce or lower the bandwidth of the signal.

The signal depicted in FIG. 2A, however, represents a theoretical depiction of a modulated carrier frequency signal. That is, in theory, a precise carrier frequency of 915 MHz is generated within the radio device by an oscillator and then modulated with the data. However, current state-of-the-art technology is unable to provide an electronic oscillator which can produce a continual and precise frequency of, for example, 915 MHz. Rather, conventional oscillators, at best, are capable of producing a precise carrier frequency to within two parts per million (ppm) of that carrier frequency. Thus, for example, an oscillator which is used for producing a carrier frequency of 915 MHz is only accurate to within 2 ppm of 915 MHz, which is equal to $(2 \times 10^{-006})$ $(915 \times 10^6)$=1830 Hz. Thus, the actual carrier frequency generated by the oscillator will be in the range of 915 MHz ±1830 Hz. The resulting theoretical signal generated from such an oscillator is shown in FIG. 2B.

Three separate signals are shown in FIG. 2B, which represent the expected minima, maxima, and average distribution of the modulated carrier frequency signal centered around a carrier frequency of 915 MHz ±1830 Hz. The first signal is shown centered around the carrier frequency ($f_c$−2 ppm)=914.998 MHz. The second signal is centered around the carrier frequency $f_c$=915 MHz. The third signal is centered around the carrier frequency ($f_c$+2 ppm)=915.002 MHz.

It is to be noted that the various signals illustrated in FIG. 2B illustrate only the expected deviations in the transmitted modulated carrier frequency signals. The receiving device must also use an oscillator to generate a carrier frequency signal in order to extract the modulated data signal therefrom. Since the carrier frequency signal generated in the receiver also has a tolerance of +2 ppm of the carrier frequency, it is possible for the net accuracy of the carrier frequency from transmitter to receiver to differ by as much as 4 ppm, which in the example of FIGS. 2A and 2B is equal to ±3660 Hz.

Fortunately, in the example shown in FIG. 2B, the bandwidth of the modulated carrier frequency signal (e.g. 11.23 KHz) is sufficiently large relative to the tolerance value of the generated carrier frequency (±1830 Hz) that the effect of the variability of the carrier frequency signal $f_c$ becomes negligible. Thus, as shown in FIG. 2B, although the actual frequency range of the bandwidth of the modulated signal may vary (depending upon the actual carrier frequency), a majority portion of the modulated signal will still be within the frequency range defined by channel filter 210.

However, as the transmitted data rate is reduced, there is a corresponding narrowing of the bandwidth of the modulated carrier frequency signal. Eventually, as the data rate is slowed to the hundreds of bits per second area or lower, the variability of the carrier frequency signal $f_c$ becomes a significant problem. This is shown, for example, in FIG. 3.

In FIG. 3, the rate of data transmission of signal 160 of FIG. 1C has been slowed from 9600 bps to 300 bps. The carrier frequency $f_c$ remains the same at 915 MHz. However, because the data rate has been slowed to 300 bps, the bandwidth of the signal (assuming MSK modulation) now becomes 351 Hz. Since the bandwidth of the channel filter 310 is typically designed to be slightly larger than the bandwidth of the modulated carrier frequency signal, there is a corresponding reduction in the bandwidth of the channel filter 310, which may, for example, have a bandwidth equal to about 400 Hz. However, the tolerance of the carrier frequency signal generated by the oscillator remains at ±2 ppm, which, at 915 MHz=1830 Hz. This means that the actual frequency range of the bandwidth of the modulated carrier frequency signal may be almost 4 times greater than or less than the frequency range defined by channel filter 310.

Thus, as shown in FIG. 3, as the rate of data transmission of the modulated carrier frequency signal is slowed, the variability of the carrier frequency signal generated by the oscillator may cause the transmitted signals to be centered around a frequency which is outside of the channel filter range 310. In such a situation, the received signal will be blocked out by the channel filter at the receiver end, resulting in data loss and broken communication.

Moreover, there is very little incentive to motivate one skilled in the art to address and solve this problem since the current trend in technology is to continually increase the bandwidth of data communications. As in most areas of computer technology, the increased use of digital electronics has led to an ever increasing need to transfer and store digitized data at a faster rate. For example, in the area of digital communication via the Internet, continual efforts are made to improve the bandwidth of data communication between two nodes on the Net.

Similarly, in the area of wireless data communication, continual efforts are made to increase the data rate of the communication signals in order to allow more data to be transferred during a given amount of time. As described above, the increase in the data rate of the modulated carrier frequency signal avoids or mitigates the problems associated with the variability of the carrier frequency signal generated by the oscillator (as described above, for example, with respect to FIGS. 2 and 3). Since mitigation of this problem can easily be achieved by increasing the data rate of the modulated signal, which is also desirable, there is little or no incentive for one skilled in the art to reduce the data rate of the modulated signal.

Contrary to conventional practice, however, the technique of the present invention teaches the desirability to lower the data rate of the modulated carrier frequency signal. Although reduction in the data rate of the modulated signal may not be desirable for most applications, it is allowable in applications such as geodetic surveying using GPS receivers because such an application does not require a high rate of data transfer. Through much research and experimentation on the part of the inventive entity of the present application, it has been discovered that wireless, remote positioning requires a data transfer rate of at least 200 bps, with an optimal data rate of about 300 bps.

These values have been determined based on the fact that the primary use of the radio communication signals between the base station and the remote survey station is for transferring data related to the correction of SATPS or GPS measurements at the remote survey locations. Thus, due to the nature of such an application, only a small amount of data needs to be communicated between the base station and the remote survey station.

However, it has also be discovered, again through research efforts by the present inventive entity, that problems arise when data rates are slowed to less than 200 bps. Such problems arise as a result of the fact that the slowed data rate is unable to keep up with the continually changing information received from the orbiting GPS satellites. Because the slowed data rate requires more time for data to be communicated between the remote survey and the base station, the GPS correctional information is not received quickly enough to keep up with the continually changing satellite positional readings received from the orbiting GPS satellites. As a result, the remote survey station is unable to utilize, in real time, the GPS correctional signals transmitted by the base station in order to improve the accuracy of the remote GPS positional measurements. It is to be noted, that in other applications where the data transmission time is not a significant issue, data rates of less than 200 bps may be used where desirable.

FIG. 4 shows a block diagram of two radio communication systems 450, 451 of the present invention, showing how the systems work in conjunction with independent timing reference signals 403 generated by orbiting SATPS satellites 402. As shown in FIG. 4, at least one timing reference signal 403, generated by at least one orbiting GPS satellite 402, is received at a respective GPS receiver 404a,b. For purposes of simplification, the following discussion will describe the operation of radio communication system 450 of FIG. 4 of the present invention, with the understanding that such description may also be applied to the operation of the other radio communication system 451 shown in FIG. 4.

Communication system 450 of FIG. 4 will now be described in greater detail. System 450 includes a wireless radio communication device 408a for transmitting and/or receiving modulated carrier frequency signals 416. The radio communication device 408a includes an oscillator 406a for generating a carrier frequency signal 407a.

The communication system 450 also includes a GPS or SATPS receiver 404a for receiving at least one standard timing reference signal 403 from at least one SATPS satellite 402. Timing reference signal 403 provides precise clock information to the GPS receiver. The precise clock information signal 415a is provided to an oscillator or clock steering circuit 414a, which compares the timing of system clock signal 409a to the timing of GPS clock signal 415a. The clock steering circuit 414a then provides a timing correctional signal 405a to the oscillator 406a to continuously adjust and improve the timing accuracy and synchronization of the oscillator to thereby improve the accuracy of the carrier frequency signal. In this way, using the timing information provided by the GPS signal 403, the accuracy of the carrier frequency signal generated by oscillator 406a can be improved to within, for example, 0.08 parts per million (ppm).

This improvement in the accuracy of the carrier frequency signal results in improved radio communication between radio device 408a and 408b. Additionally, by synchronizing or phase locking each of the oscillators in each respective communication system 450, 451 to the GPS timing reference signal 403 (which is generated independently, outside of the communication system), each of the oscillators 404a,b will be synchronized to each other. This is advantageous in that synchronization of the oscillators is achieved without requiring conventional synchronization procedures, which typically encode synchronization information into a portion of the wireless signals communicated between the radio devices to thereby achieve synchronization of the two oscillators. An example of a conventional synchronization technique is described in U.S. Pat. No. 4,301,537 to Roos.

In a preferred embodiment of the present invention, the radio device defined by block 600 of FIG. 4 may be a spread spectrum radio having specifications in compliance with Part 15 of Title 47 of the Code of Federal Regulations (C.F.R.). More specifically, the spread spectrum radio device may comply with Title 47, Section 15.247 of the United States Code of Federal Regulations, wherein a user of the radio device is not required to obtain a FCC license to operate the radio device. Additionally, the spread spectrum radio device of the present invention may be either a direct sequence system or a frequency hopping system.

FIG. 6 illustrates a schematic diagram of the radio device 600 of FIG. 4. It is to be noted that the diagram of FIG. 6 is only one example of how the technique of the present invention can be incorporated into conventional radio communication devices.

It is to be noted that the technique of the present invention may be applied to other wireless radio communication devices conventionally known to those skilled in the art without departing from the scope or the spirit of the present invention. Additionally, the radio device of the present invention may include either a transmitter or a receiver or both. This has the advantage in that some applications of remote geodetic surveying need only include receiver units at the remote station. The receiver only unit is advantageous in that it is small in size, lightweight, and requires very low power for operation.

FIG. 5 illustrates the expected distribution of the modulated carrier frequency signal 416 of FIG. 4 which is transmitted by the radio system 450 of the present invention. Because of the improved accuracy of the carrier frequency signal, the distribution of the signals of FIG. 5 are centered around a carrier frequency of $f_c$ ±0.08 ppm. The modulated data rate of the signal has been slowed to 300 bps, and the carrier frequency $f_c$ is equal to 915 MHz.

In the example shown in FIG. 5, it can be seen that the improvement in the accuracy of the carrier frequency $f_c$ allows the bandwidth of the data signal to be reduced without experiencing the associated problems described above with respect to FIG. 3. Furthermore, as described in greater detail below, the reduction in the bandwidth of the modulated carrier frequency signals allows for a significant increase in the effective communication range of the radio devices of the present invention by improving their sensitivity.

More importantly, the increased accuracy in the carrier frequency signal using the technique of the present invention can be used to increase the effective communication range of the radio system. More specifically, as shown in FIG. 5, for example, the increased accuracy of the carrier frequency signal allows for the bandwidth of the modulated signals to be decreased which, in turn, as explained in detail below, provides for a significant increase in the range of the modulated signals by significantly increasing its signal-to-noise ratio (SNR). Thus, the effective communicating range of the radio system of the present invention may be significantly improved without increasing the output power of the transmitted signal by using the SATPS timing reference signals to improve the accuracy of the carrier frequency signal while simultaneously decreasing the bandwidth of data communication of the modulated carrier frequency signals.

The following example is used for illustrated purposes in order to describe how the technique of the present invention can be used to significantly increase the effective communication range of a conventional wireless radio device. For purposes of simplification and illustration, it is assumed that the radio device described in this example is able to transmit a modulated carrier frequency signal similar to that shown in FIG. 2A, wherein the carrier frequency $f_c$ is 915 MHz and the data rate of the modulated signal is 9600 HZ. Additionally, it is assumed for this example that the carrier frequency is modulated using MSK modulation.

As is commonly known to those skilled in the art, the signal strength of a transmitted signal is independent of both noise and bandwidth. Thus, a signal transmitted at an output power of 1 watt has a signal strength of 1 watt. One way of increasing the effective communication range of a radio device is to increase the output power of its transmitted signal. However, as explained above, this may be undesirable or even unlawful due to regulatory constraints imposed by United States Federal Communications Commission.

At the receiver end, it is the signal-to-noise ratio (SNR) of the received signal which is important and determinative in recovering information contained in the modulated carrier frequency signal. For each type of modulation scheme, there is a minimum SNR threshold ($S_{th}$) of the received signal below which the data encoded in the modulated carrier frequency signal can no longer be recovered.

The SNR of a signal is dependent upon the bandwidth of a signal and upon the distance (or range) between the transmitter and receiver. Generally speaking, a signal with a relatively wide bandwidth will include more background noise than a signal with a relatively narrow bandwidth. This is due to the fact that there exists noise on all frequencies of the electromagnetic spectrum. Thus, the larger the bandwidth, the greater the amount of background noise included within the bandwidth. The strength of the background noise for a given bandwidth may be expressed by the equation:

$$\text{Noise power (watt)} = (k)(BW),$$

where k is a constant and BW is the bandwidth of the signal. The above formula may be expressed in terms of decibels relative to 1 watt (dBW) by the equation:

$$\text{Noise power (dBW)} = 10 \log (kBW).$$

As described above, the bandwidth of a signal is directly proportional to the data rate of the modulating data signal. Thus, the bandwidth of a signal modulated at a frequency of 9600 Hz may be expressed by the equation:

$$BW_{9600} = (n)(9600),$$

where n is a constant which is dependent upon the type of modulation scheme used.

The associated noise strength for the 9600 Hz modulated signal may be expressed as:

$$\text{Noise}_{9600} = 9600(k)(n).$$

However, where the data rate of the modulated signal is slowed to 300 Hz, the bandwidth of the signal may be expressed as:

$$BW_{300} = (n)(300).$$

When compared against the bandwidth of the 9600 Hz signal, the input noise for the 300 Hz signal is significantly less, and may be expressed by the equation:

$$\text{Noise}_{300} = 300(k)(n).$$

Comparing the noise values for the 9600 Hz signal and the 300 Hz signal, the ratio of $\text{Noise}_{9600}/\text{Noise}_{300}=32$, meaning that the strength of the background noise of the 9600 Hz signal is 32 times more powerful than that of the 300 Hz signal. In terms of decibels, this value may be expressed as $10 \log (32) = 15$ dB.

This means that, by reducing the data rate of the modulated carrier frequency signal from 9600 Hz to 300 Hz, the strength of the noise component of the signal may be reduced by 15 dB. Since the signal strength of the modulated signals is not effected by the reduction in bandwidth, the SNR of the 300 Hz modulated signal is increased relative to that of the 9600 Hz modulated signal by 15 dB.

Thus, using the technique of the present invention, GPS timing reference signals may be used to continually adjust the timing and synchronization of the oscillator to improve the accuracy of the carrier frequency signal to within at least 0.08 ppm. This improved accuracy in the carrier frequency signal permits the bandwidth of the signal to be substantially narrowed while avoiding the problems discussed above related to data loss and communication failure due to variability of the oscillator frequency. The reduction in bandwidth of the modulated signal, in turn, provides for a significant increase in the SNR of the modulated signals without increasing the output power of the transmitted signal, thereby improving and facilitating communication and wireless data transfer between the transmitter and receiver.

Moreover, as described in greater detail below, the increase in SNR of the modulated signal allows for a corresponding increase in the effective communication range of the signal.

As commonly known to those skilled in the art, as the distance or range between the transmitter and receiver increases, the SNR of the received signal decreases relative to the equation:

$$\text{Signal Strength (dB)} = 20 \log\left(\frac{4\pi R}{\lambda}\right)$$

where R is the radius or range between the transmitter and receiver, and $\lambda$ is the carrier frequency $f_c$ of the modulated signal.

As stated previously, for each type of modulation scheme, there is a minimum threshold SNR level ($S_{th}$) for a modulated signal below which the signal itself or the data therein can no longer be recovered. In other words, when the SNR of a modulated signal falls below a threshold value $S_{th}$, the signal itself becomes indistinguishable from the noise component of the received signal. In the example above, it is assumed that the SNR of the 9600 Hz modulated signal reaches its threshold level $S_{th}$ at a range of $R_1$. Thus, at the range $R_1$, SNR=$S_{th}$ at 9600 bps.

Recalling the example above, as the data rate is slowed to 300 bps, an increase of 15 dB is achieved in the SNR of the signal, relative to the 9600 Hz signal. This means, at 300 bps, SNR=$S_{th}$+15 dB. This extra 15 dB in the SNR of the 300 Hz signal provides for an increased range, $R_2$, of the 300 Hz signal.

Thus, at 9600 Hz, $$S_{th}(\text{dB}) = 20 \log\left(\frac{4\pi R_1}{\lambda}\right) @ 9600 \text{ Hz}$$

At 300 Hz, $$S_{th} + 15\text{dB} = 20 \log\left(\frac{4\pi R_2}{\lambda}\right) @ 300 \text{ Hz}$$

Solving for variables $R_2$ and $R_1$ we find that $R_2=5.62R_1$, meaning that the range $R_2$ is 5.62 times that of $R_1$.

Thus, as explained above, the technique of the present invention uses at least one GPS timing reference signal to continually correct and maintain precise timing and synchronization of the radio system oscillator and thereby improve the accuracy of the carrier frequency signal. This improved accuracy in the carrier frequency signal is then used to increase the effective communication range of the radio device without increasing the output power of the transmitted signals or the antennae gain of the received signals. More specifically, the increase in effective communicating range of the radio device is accomplished by improving the accuracy of the frequency of the carrier frequency signals and simultaneously decreasing the data rate or bandwidth of the modulated carrier frequency signal.

Additionally, it is to be noted that the channel bandwidth of a communications receiver affects the sensitivity of the receiver. As explained below, by lowering the bandwidth of the modulated carrrier frequency signal, the radio device(s) of the present invention are able to achieve improved sensitivity over conventional radio devices. The following text provides a description of the relationship between receiver sensitivity and channel bandwidth.

As stated previously, the received signal power is unaffected by the final channel bandwidth, provided that the signal occupies less bandwidth than the channel. For purposes of this discussion, it is assumed that the received signal strength=S.

Noise sources affect the signal-to-noise ratio of the received signal, and may be represented as:

Noise power is given by: $P_n = kT \cdot BW$ (Watts), where T is the absolute temperature of the system in degrees Kelvin (293 for room temp), k is Boltzman's constant which equals $1.38 \times 10^{-23}$, and BW is the bandwidth of interest in Hz.

As described previously in this application, the signal-to-noise ratio is improved by lowering the signal and noise bandwidth. The sensitivity of a receiver is defined as a power level where the bit error rate (BER) reaches a predetermined level. The bit error rate (BER) is usually given along with the power level. For example, the sensitivity of the preferred embodiment at 1200 bps is given as −121 dBm at a BER of $10^{-5}$, where dBm is decibels relative to one milliwatt.

Each modulation scheme needs a certain SNR to achieve the required BER. For the receiver of the present invention, the sensitivity may be calculated as follows.

From Sklar FIG. 3.22 (reproduced as FIG. 7 in the present application), the required SNR for noncoherent FSK is about 14 dB. This value is close to noncoherent MSK. The self generated noise in the front end of a typical receiver adds about 4dB to the thermal noise. This is called the Noise Figure. Therefore, the signal should preferably be 14dB+ 4dB=18 dB above the noise for the proper BER performance.

Recalling the formula for noise power (above), $P_n(dBm) = 10 \log_{10}[P_n * 1000]$ in the units dBm. The bandwidth, BW, is about (1.17)*(Bitrate for MSK). The sensitivity is, therefore, the noise power plus the 14 dB for proper MSK performance, plus 4 dB to get over the noise figure of the receiver. The following table reflects the performance of the radio system of the present invention at various data rates:

| Bit rate (Hz) | Bandwidth (Hz) | Noise Power in dBm | Sensitivity (dBm) | @BER |
|---|---|---|---|---|
| 300 | 351 | −148.5 | −130.5 | $10^{-5}$ |
| 600 | 702 | −145.5 | −127.5 | $10^{-5}$ |
| 1200 | 1404 | −142.5 | −124.5 | $10^{-5}$ |
| 2400 | 2808 | −139.4 | −121.4 | $10^{-5}$ |
| 4800 | 5616 | −136.4 | −118.4 | $10^{-5}$ |
| 9600 | 11232 | −133.4 | −115.4 | $10^{-5}$ |

The values above assume a fixed narrow channel filter at about 15kHz to 25kHz wide to allow data rates of up to 9600 bps. The digital signal processing (DSP) circuit filters the remaining noise when operating at the lower data rates. Moreover, the data rate of signal 416 of the present invention is able to be changed automatically via the microcontroller in the system in order to achieve a desired sensitivity to suit a particular application.

Thus, as seen from the above table, improved sensitivity is the result of narrowing the bandwidth. The present invention is able to achieve a sensitivity of at least −120 dBm (i.e. −120 dBm or lower) for data rates of 2400 bps and lower while simultaneously overcoming the problems associated with conventional radio systems related to oscillator frequency accuracy.

Additionally, synchronization of each of the oscillators in each of the radio devices in the communication system of the present invention is accomplished by synchronizing each of the oscillators to the independent GPS timing reference signal (or other independent reference signals) generated outside of the system. This differs from conventional techniques which attempt to synchronize the oscillator of one radio device to the oscillator of another radio device by transmitting synchronization information embedded into the modulated carrier frequency signal. For example, conventional spread spectrum systems need first to obtain a lock onto the signal transmitted by another spread spectrum radio device. Once signal lock has been achieved, synchronization between the two devices is established by transmitting synchronization information embedded into the modulated carrier frequency signals. After that, the devices may then proceed with data communication. The technique of the present invention eliminates the need for searching and locking algorithms for the purpose of establishing synchronization between the two oscillators.

Additionally, the technique of the present invention may be used to eliminate synchronization algorithms used in conventional frequency hopping spread spectrum systems. For example, before conventional frequency hopping spread spectrum devices are able to communicate with each other, a search algorithm must be performed so that the frequency hopping pattern of each device is synchronized with the other in order to allow subsequent transmission of modulated data.

However, the technique of the present invention eliminates the need for such search algorithms since the information contained in the SATPS timing reference signals can be used directly in each of the respective radio devices to independently establish a frequency hopping pattern in each radio device which is in synchronism with the frequency hopping pattern in each of the other radio devices of the present invention. For example, in the embodiment where the radio device of the present invention is a frequency hopping spread spectrum radio, the timing signals from the GPS satellite may be used to synchronize the hopping sequence in each of the radio transmittal/receivers. For example, components of the GPS timing reference signal, such as the one millisecond pulse, the 1 PPS signal, and the Seconds of the Week component may be used to determine the hopping code in each of the radio devices.

Although several preferred embodiments of this invention have been described in detail herein with reference to the accompanying drawings, it is to be understood that the invention is not limited to these precise embodiments, and that various changes and modifications may be affected therein by one skilled in the art without departing from the scope or spirit of the invention as defined in the appended claims.

It is claimed:

1. A portable, wireless radio communication system comprising:
    at least one wireless spread spectrum radio communication device, said device including an oscillator for generating a clock signal and a carrier frequency signal, said carrier frequency signal having a predetermined frequency stability and further having a predetermined carrier minimum bandwidth determined by the extreme frequency excursion of said oscillator;
    a channel filter accommodating a predetermined channel bandwidth only slightly larger than said predetermined carrier minimum bandwidth;
    a SATPS receiver in communication with the radio device, wherein the SATPS receiver receives at least one standard timing reference signal from at least one SATPS satellite; and
    correction means for using said timing reference signal to continuously adjust and improve the accuracy of said carrier frequency reference signal, said correction means increasing the frequency stability of said carrier frequency signal to a level higher than said predetermined frequency stability while also simultaneously reducing the channel bandwidth of said channel filter to a value smaller than that of said predetermined channel bandwidth and that of said predetermined carrier minimum bandwidth.

2. The system of claim 1 wherein said correction means includes at least one timing correction signal communicating between the SATPS receiver and the oscillator for continuously adjusting and maintaining precise timing of the oscillator in order to improve and maintain precise accuracy of said carrier frequency signal.

3. The system of claim 2 wherein said at least one spread spectrum radio device has specifications in compliance with Title 47, Section 15.247 of the United States Code of Federal Regulations, wherein a user of said radio device is not required to obtain an FCC license to operate said radio device.

4. The system of claim 3 wherein a rate of data transmission of said at least one spread spectrum radio device falls below 2400 bits per second (bps).

5. The system of claim 3 wherein said rate of data transmission of said at least one spread spectrum radio device is in the range of about 2400–10 bps.

6. The system of claim 3 wherein said at least one spread spectrum radio device includes a transmitter operating at an output power of at most one Watt, and wherein said system includes means for reducing a bandwidth of a transmitted radio signal such that said at least one radio device achieves an effective broadcast range of greater than 25 kilometers.

7. The system of claim 3 wherein said system includes means for reducing or filtering a bandwidth of a received radio signal such that said at least one spread spectrum radio device achieves a sensitivity of at least −120 dBm.

8. The system of claim 7 wherein said radio signal is devoid of oscillator synchronization information for synchronizing said oscillator of said at least one spread spectrum radio device with an oscillator of another radio device.

9. The system of claim 1 wherein the accuracy of said carrier frequency signal is within 0.08 parts per million (ppm).

10. A method for improving communication range of a spread spectrum radio communication system, said system including a mobile spread spectrum radio communication device including an oscillator for generating a carrier frequency signal, said carrier frequency signal having a predetermined carrier minimum bandwidth determined by the extreme frequency excursions of said oscillator, and a channel filter accommodating a predetermined channel bandwidth only slightly larger than said predetermined carrier minimum bandwidth, said system further including an SATPS receiver, said method comprising the steps of:
    (a) receiving at least one standard timing reference signal from at least one SATPS satellite,
    (b) using said received timing reference signal to continually correct and maintain precise timing and synchronization of said oscillator to thereby provide improved accuracy of said carrier frequency signal; and
    (c) utilizing the improved accuracy of the carrier frequency signal to increase the frequency stability of said carrier frequency signal to a level higher than said predetermined frequency stability while also simultaneously reducing the channel bandwidth of said channel filter to a value smaller than that of said predetermined channel bandwidth and that of said predetermined carrier minimum bandwidth.

11. The method of claim 10 wherein said using step (b) includes the step of improving the accuracy of said carrier frequency signal to within 0.08 parts per million (ppm).

12. The method of claim 10 wherein said utilizing step (c) includes the step of increasing effective communication range of the spread spectrum radio device without increasing output power of transmitted signals from the spread spectrum radio device.

13. The method of claim 12 wherein said method further includes the step of complying with operating requirements of said radio device under Title 47, Section 15.247 of the United States Code of Federal Regulations.

14. The method of claim 13 further including the step of transmitting data from said spread spectrum radio at a rate of at most 2400 bits per second (bps).

15. The method of claim 13 wherein said step (c) includes the step of reducing or filtering a bandwidth of a radio signal such that said spread spectrum radio device achieves a sensitivity of at least −120 dBm without encoding oscillator synchronization information into said radio signal.

16. In a portable, wireless radio communication system having a reference oscillator generating a clock signal and a carrier signal, said carrier signal frequency having a predetermined frequency stability and further having a predetermined carrier minimum bandwidth determined by the extreme frequency excursions of said oscillator, and a channel filter accommodating a predetermined channel bandwidth only slightly larger than said predetermined carrier minimum bandwidth, the improvement comprising:
    at least one wireless spread spectrum radio communication device having said reference oscillator and said channel filter,
    a SATPS receiver in communication with said at least one radio device, wherein the SATPS receiver receives at least one standard timing reference signal from at least one SATPS satellite; and a correction circuit responsive to said timing reference signal and coupled to said reference oscillator and said channel filter, said correction circuit increasing the frequency stability of said carrier signal to a level higher than said predetermined frequency stability while also simultaneously reducing the channel bandwidth of said channel filter to a value smaller than that of said predetermined channel bandwidth and that of said predetermined carrier minimum bandwidth.

17. The system of claim 16 wherein said correction circuit includes at least one timing correction signal communicating between the SATPS receiver and the oscillator for continuously adjusting and maintaining precise timing of the oscillator in order to improve and maintain precise accuracy of said carrier frequency signal.

18. The system of claim 16 wherein the accuracy of said carrier frequency signal is within 0.08 parts per million (ppm).

19. The system of claim 17 wherein said radio device is a spread spectrum radio having specifications in compliance with Title 47, Section 15.247 of the United States Code of Federal Regulations, wherein a user of said radio device is not required to obtain an FCC license to operate said radio device.

20. The system of claim 19 wherein a rate of data transmission of said spread spectrum radio falls below 2400 bits per second (bps).

21. The system of claim 19 wherein said rate of data transmission of said spread spectrum radio is in the range of about 2400–10 bps.

22. The system of claim 19 wherein said spread spectrum radio includes a transmitter operating at an output power of at most one Watt, and wherein said system includes means for reducing a bandwidth of a transmitted radio signal such that said at least one radio device achieves an effective broadcast range of greater than 25 kilometers.

23. The system of claim 19 wherein said system includes means for reducing or filtering a bandwidth of a received radio signal such that said at least one radio device achieves a sensitivity of at least −120 dBm.

24. The system of claim 19 wherein said radio signal is devoid of oscillator synchronization information for synchronizing said oscillator of said at least one radio device with an oscillator of another radio device.

* * * * *